(12) United States Patent
Huang et al.

(10) Patent No.: US 8,288,853 B2
(45) Date of Patent: Oct. 16, 2012

(54) THREE-DIMENSIONAL PACKAGE AND METHOD OF MAKING THE SAME

(75) Inventors: Min-Lung Huang, Kaohsiung (TW);
Wei-Chung Wang, Kaohsiung (TW);
Po-Jen Cheng, Kaohsiung (TW);
Kuo-Chung Yee, Kaohsiung (TW);
Ching-Huei Su, Kaohsiung (TW);
Jian-Wen Lo, Kaohsiung (TW);
Chian-Chi Lin, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 528 days.

(21) Appl. No.: 12/615,852

(22) Filed: Nov. 10, 2009

(65) Prior Publication Data

US 2010/0052136 A1  Mar. 4, 2010

Related U.S. Application Data

(63) Continuation of application No. 11/584,546, filed on Oct. 23, 2006, now Pat. No. 7,642,132.

(30) Foreign Application Priority Data

Jan. 25, 2006 (TW) .............................. 95102837 A

(51) Int. Cl.
*H01L 23/02* (2006.01)

(52) U.S. Cl. ........................................ 257/686; 438/109
(58) Field of Classification Search .................. 257/686, 257/777, E23.068, E23.178, E25.013; 438/109, 438/458, 618
See application file for complete search history.

(56) References Cited

U.S. PATENT DOCUMENTS

| | | |
|---|---|---|
| 4,499,655 A | 2/1985 | Anthony |
| 5,229,647 A | 7/1993 | Gnadinger |
| 5,404,044 A | 4/1995 | Booth et al. |
| 6,812,549 B2 | 11/2004 | Umetsu et al. |

*Primary Examiner* — David Vu
(74) *Attorney, Agent, or Firm* — McCracken & Frank LLC

(57) ABSTRACT

A package comprises a first unit including a semiconductor body, a hole, an isolation layer, a conductive layer and a solder. The semiconductor body has a first surface having a pad and a protection layer exposing the pad. The hole penetrates the semiconductor body. The isolation layer is disposed on the side wall of the hole. The conductive layer covers the pad, a part of the protection layer, and the isolation layer. The lower end of the conductive layer extends to below a second surface of the semiconductor body. The solder is disposed in the hole, and is electrically connected to the pad via the conductive layer. A second unit similar to the first unit and stacked thereon includes a lower end of a second conductive layer that extends to below a second surface of a second semiconductor body and contacts the upper end of the first solder.

10 Claims, 11 Drawing Sheets

THREE-DIMENSIONAL PACKAGE AND METHOD OF MAKING THE SAME

BACKGROUND OF THE INVENTION

1. Field of the Invention

The present invention relates to a package and a method of making the same, and more particularly to a three-dimensional package and a method of making the same.

2. Description of the Related Art

Referring to FIG. 1, it shows a schematic view of a three-dimensional package before reflow disclosed in U.S. Pat. No. 4,499,655.

The three-dimensional package 1 comprises a first unit 10 and a second unit 20. The first unit 10 comprises a first semiconductor body 11, at least one first hole 12, a first conductive layer 13 and a first solder 14. The first semiconductor body 11 has a first surface 111 and a second surface 112. The first surface 111 has at least one first pad (not shown) and a first protection layer 113 exposing the first pad. The first hole 12 penetrates the first semiconductor body 11. The first conductive layer 13 is disposed on the side wall of the first hole 12 and covers the first pad and the first protection layer 113. The first solder 14 is disposed in the first hole 12 and is electrically connected to the first pad via the first conductive layer 13. The upper end of the first solder 14 extends to above the first surface 111 of the first semiconductor body 11, and the lower end of the first solder 14 extends to below the second surface 112 of the first semiconductor body 11.

The second unit 20 is stacked on the first unit 10. The second unit 20 comprises a second semiconductor body 21, at least one second hole 22, a second conductive layer 23 and a second solder 24. The second semiconductor body 21 has a first surface 211 and a second surface 212. The first surface 211 has at least one second pad (not shown) and a second protection layer 213 exposing the second pad. The second hole 22 penetrates the second semiconductor body 21. The second conductive layer 23 is disposed on the side wall of the second hole 22 and covers the second pad and the second protection layer 213. The second solder 24 is disposed in the second hole 22 and is electrically connected to the second pad via the second conductive layer 23. The upper end of the second solder 24 extends to above the first surface 211 of the second semiconductor body 21, and the lower end of the second solder 24 extends to below the second surface 212 of the second semiconductor body 21. The lower end of the second solder 24 is aligned with and contacts the upper end of the first solder 14. After performing a reflow process, the first unit 10 and the second unit 20 are joined to form a three-dimensional package 1, as shown in FIG. 2.

In the three-dimensional package 1, the first solder 14 and the second solder 24 are formed by disposing the first semiconductor body 11 and the second semiconductor body 21 above a solder bath, and the solder enter the first hole 12 and the second hole 22 according to the capillary phenomenon so as to form the first solder 14 and the second solder 24.

The disadvantages of the three-dimensional package 1 are described as follows. As the first solder 14 and the second solder 24 are formed according to the capillary phenomenon, the upper and the lower ends of the foregoing solders are in a hemispherical shape (FIG. 1). As such, when the first unit 10 and the second unit 20 are aligned and joined, alignment becomes more difficult and the joining between the first unit 10 and the second unit 20 after reflow is not stable. Moreover, after the joining of the first unit 10 and the second unit 20, the overall height cannot be effectively reduced due to the excess hemispherical solders.

Therefore, it is necessary to provide a three-dimensional package and a method of making the same to solve the above problems.

SUMMARY OF THE INVENTION

According to one example, a three-dimensional package comprises a first unit and a second unit. The first unit comprises a first semiconductor body, at least one first hole, a first isolation layer, a first conductive layer and a first solder.

The first semiconductor body has a first surface and a second surface. The first surface has at least one first pad and a first protection layer exposing the first pad. The first hole penetrates the first semiconductor body. The first isolation layer is disposed on the side wall of the first hole. The first conductive layer covers the first pad, a part of the first protection layer and the first isolation layer. The lower end of the first conductive layer extends to below the second surface of the first semiconductor body. The first solder is disposed in the first hole, and is electrically connected to the first pad via the first conductive layer.

The second unit is stacked on the first unit. The second unit comprises a second semiconductor body, at least one second hole, a second isolation layer, and a second conductive layer. The second semiconductor body has a first surface and a second surface. The first surface has at least one second pad and a second protection layer exposing the second pad. The second hole penetrates the second semiconductor body. The second isolation layer is disposed on the side wall of the second hole. The second conductive layer covers the second pad, a part of the second protection layer and the second isolation layer. The lower end of the second conductive layer extends to below the second surface of the second semiconductor body and contacts the upper end of the first solder.

DETAILED DESCRIPTION OF THE INVENTION

Figure 1:
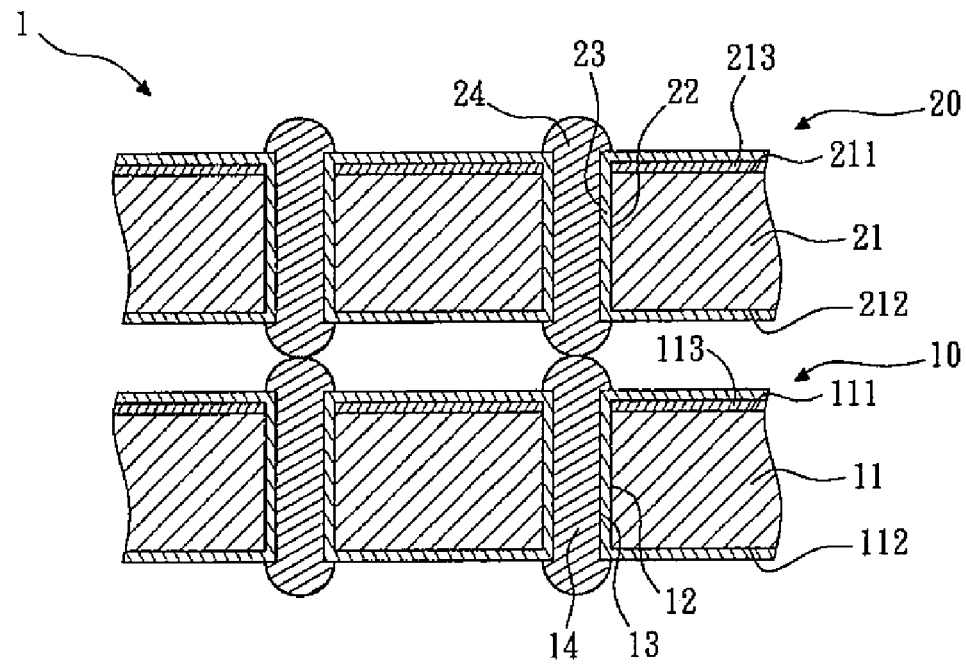
FIG. 1 shows a schematic view of the three-dimensional package before reflow disclosed in U.S. Pat. No. 4,499,655.
Figure 2:
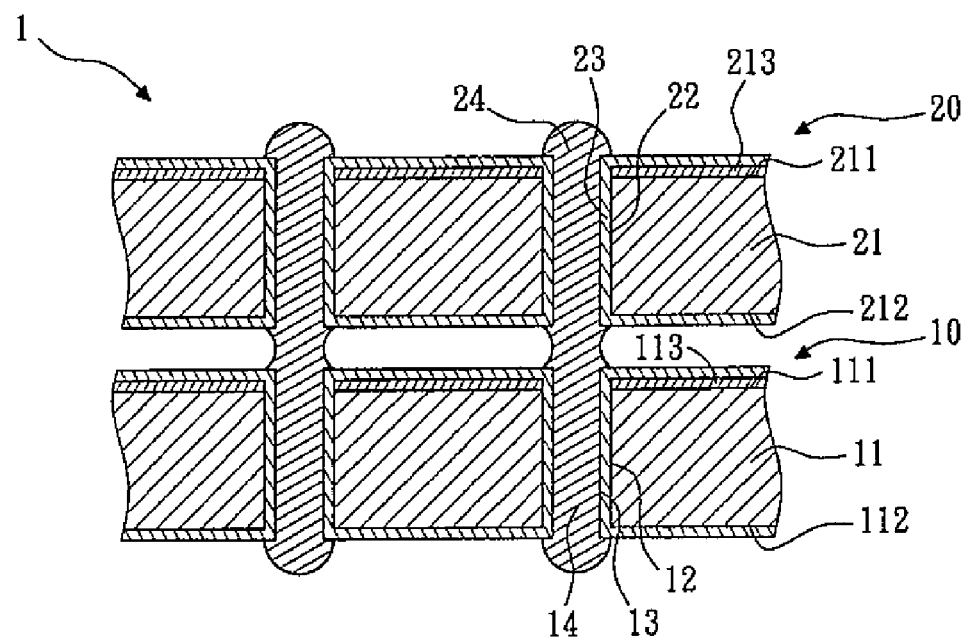
FIG. 2 shows a cross-sectional view of the three-dimensional package after reflow disclosed in U.S. Pat. No. 4,499,655.
Figure 3:
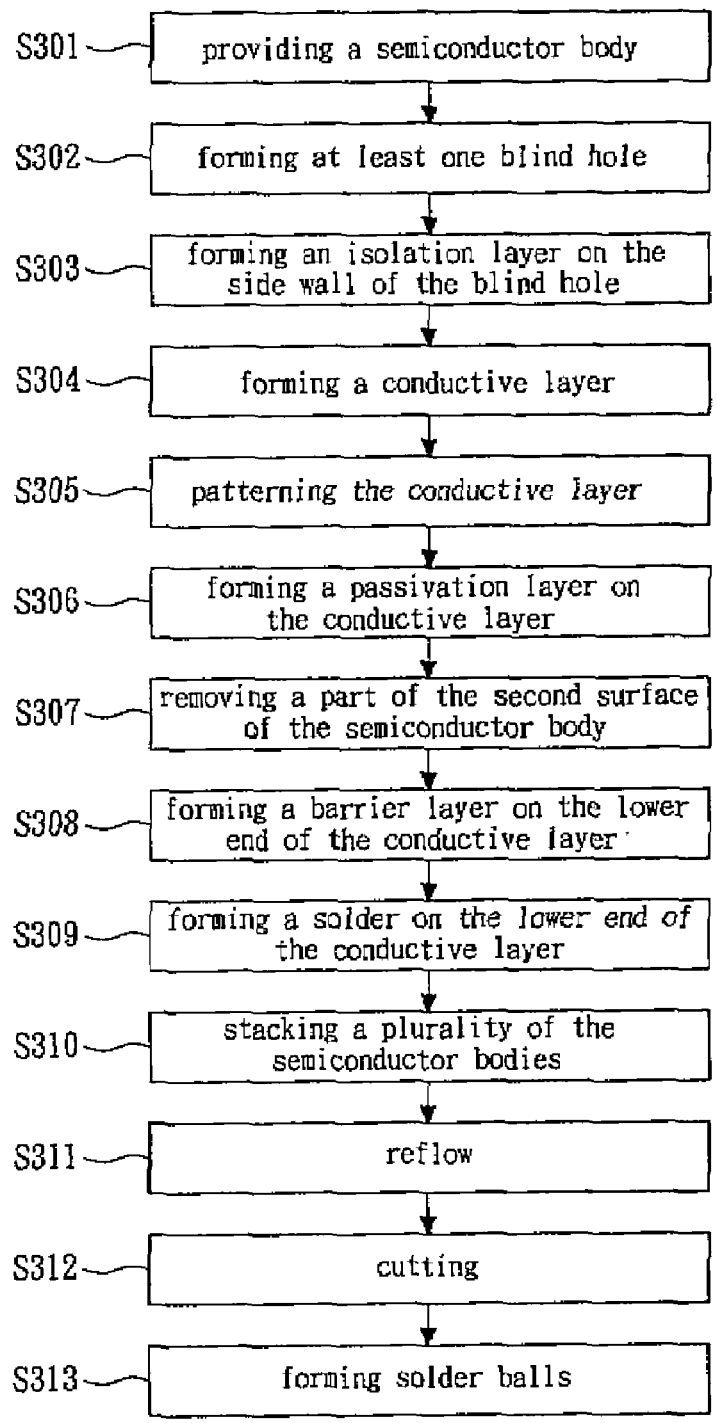
FIG. 3 shows a schematic flow chart of the method of making a three-dimensional package according to the first embodiment of the present invention.
Figure 4:
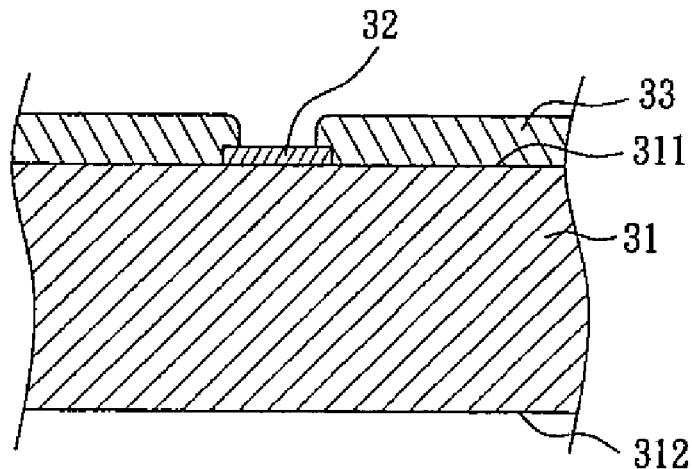
FIGS. 4 to 15 show the schematic views of each process step of the method of making a three-dimensional package according to the first embodiment of the present invention.

Referring to FIG. 3, it shows a schematic flow chart of the method of making a three-dimensional package according to the first embodiment of the present invention. Referring to FIGS. 4 to 15, the schematic views of each process step of the method of making a three-dimensional package according to the first embodiment of the present invention are shown. First, referring to FIGS. 3 and 4, as shown in step S301, a semiconductor body 31 is provided. The semiconductor body 31 is a wafer or a chip. The semiconductor body 31 has a first surface 311 and a second surface 312. The first surface 311 has at least one pad 32 and a protection layer 33 exposing the pad 32.

Figure 5:
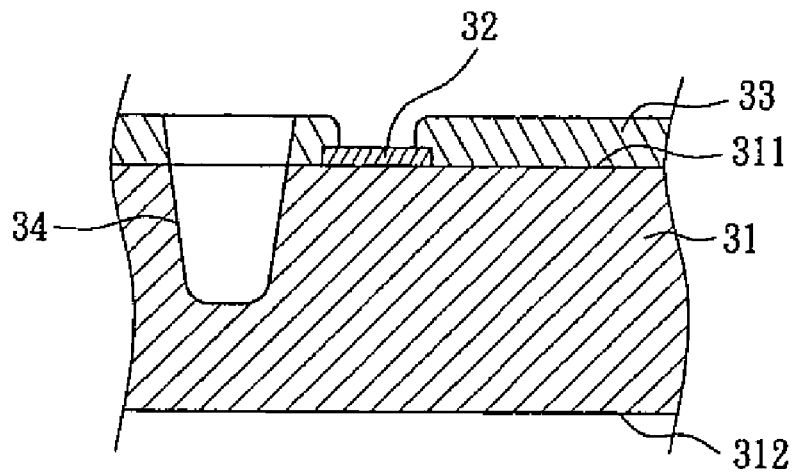

Then, referring to FIGS. 3 and 5, as shown in step S302, at least one blind hole 34 is formed on the first surface 311 of the semiconductor body 31. In the embodiment, the blind hole 34 is disposed beside the pad 32. Alternatively, the blind hole 34 can penetrate the pad 32.

Figure 6:
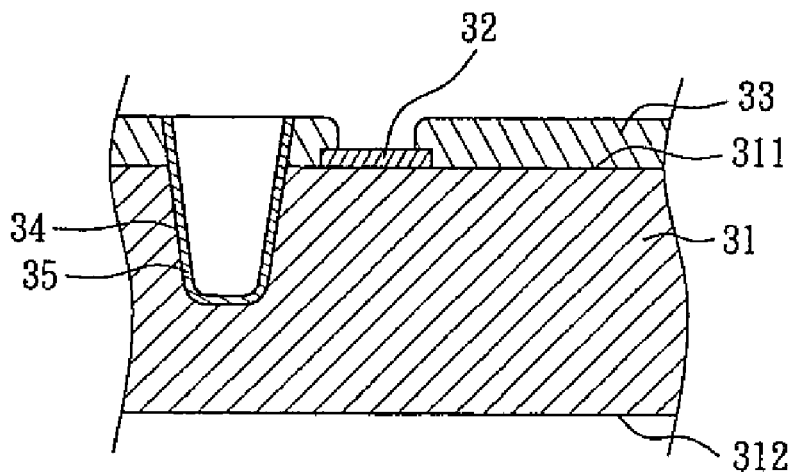

Next, referring to FIGS. 3 and 6, as shown in step S303, an isolation layer 35 is formed on the side wall of the blind hole 34.

Figure 7:
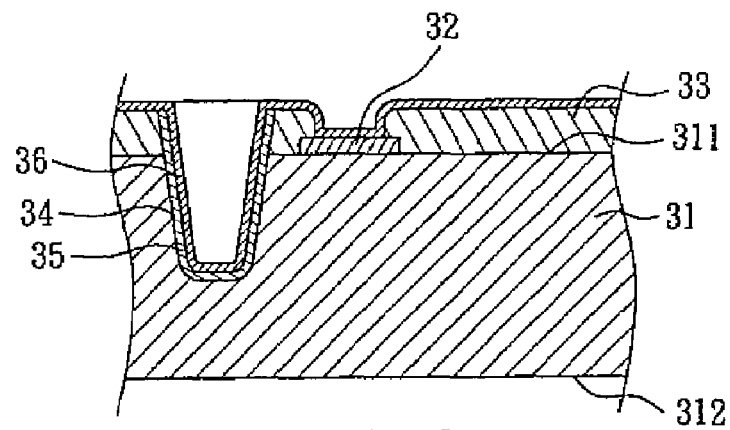

Afterward, referring to FIGS. 3 and 7, as shown in step S304, a conductive layer 36 is formed to cover the pad 32, the protection layer 33 and the isolation layer 35. The conductive layer 36 is made of Ti, Cu, Cu/Ti alloy, or other metals.

Figure 8:
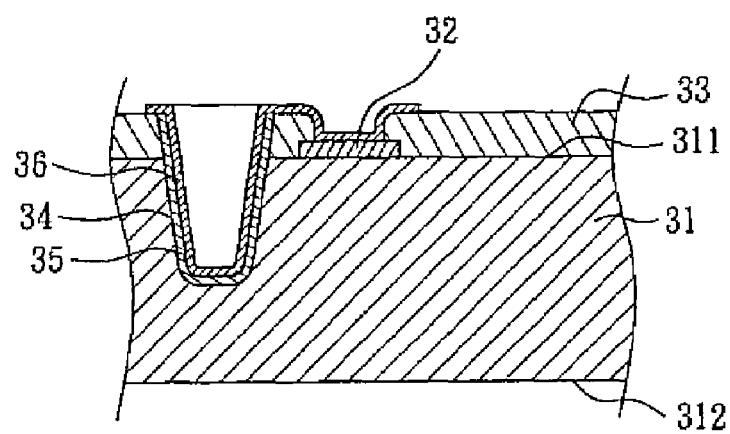

Then, referring to FIGS. 3 and 8, as shown in step S305, the conductive layer 36 is patterned.

Figure 9:
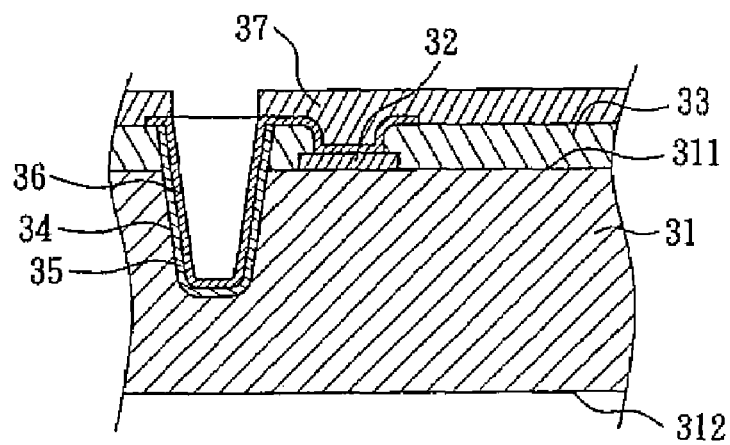

After that, referring to FIGS. 3 and 9, preferably, as shown in step S306, a passivation layer 37 is formed on the conductive layer 36 to protect the patterned conductive layer 36. The passivation layer 37 can be formed in any conventional manners. Moreover, it should be understood that this step is optional.

Figure 10:
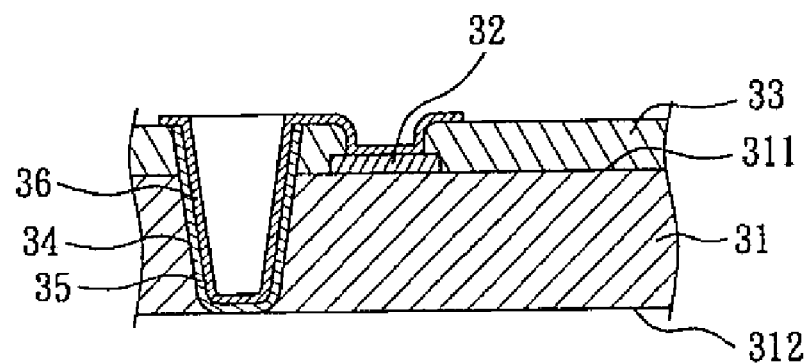
Figure 11:
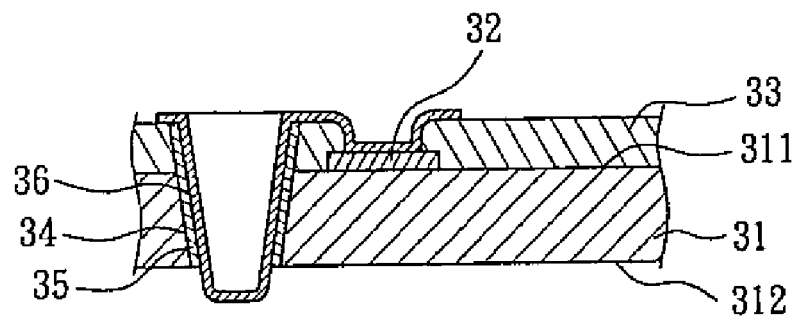

Then, as shown in step S307, a part of the second surface 312 of the semiconductor body 31 and a part of the isolation layer 35 are removed to expose a part of the conductive layer 36. Referring to FIG. 10, in the present embodiment, the second surface 312 of the semiconductor body 31 is first ground by means of backside grinding until the second surface 312 and the lower end of the isolation layer 35 are at the same level, i.e., the lower end of the isolation layer 35 is exposed on the second surface 312. Then, the second surface 312 of the semiconductor body 31 and the lower end of the isolation layer 35 are etched to expose the lower end of the conductive layer 36. At this moment, the lower end of the conductive layer 36 extends to below the second surface 312 of the semiconductor body 31, as shown in FIG. 11. However, it should be understood that in other applications, the second surface 312 of the semiconductor body 31 can be directed etched to expose the lower end of the conductive layer 36, without performing the backside grinding.

Figure 12:
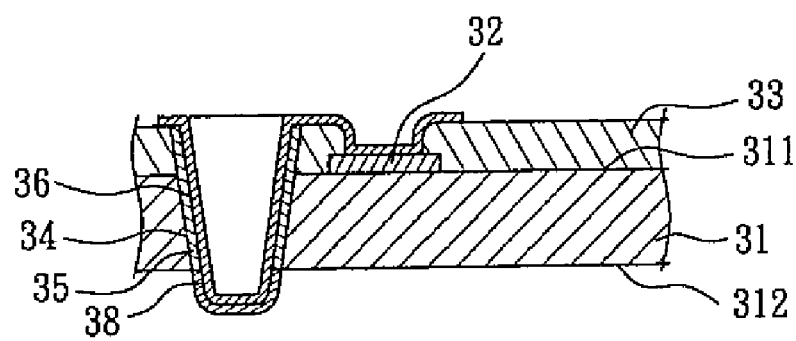

Afterward, referring to FIGS. 3 and 12, preferably, as shown in step S308, a barrier layer 38 is formed on the lower end of the conductive layer 36, and covers the lower end of the exposed conductive layer 36. The barrier layer 38 is Ni, Cr, Cr/Cu alloy, or other metals. It should be understood that this step is optional.

Figure 13:
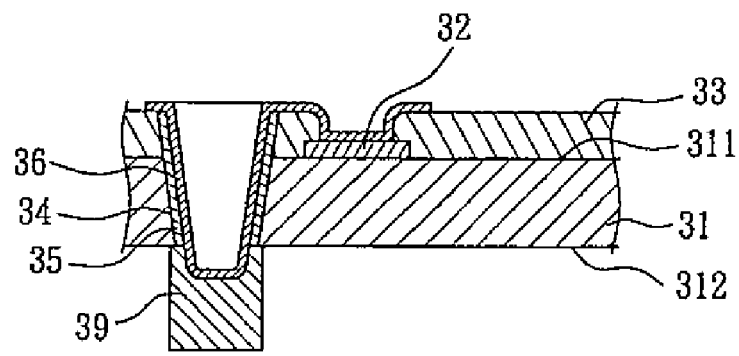

Next, referring to FIGS. 3 and 13, as shown in step S309, a solder 39 is formed, which is attached to the lower end of the conductive layer 36. It should be understood that the solder 39 can be formed by plating or other conventional manners.

Figure 14:
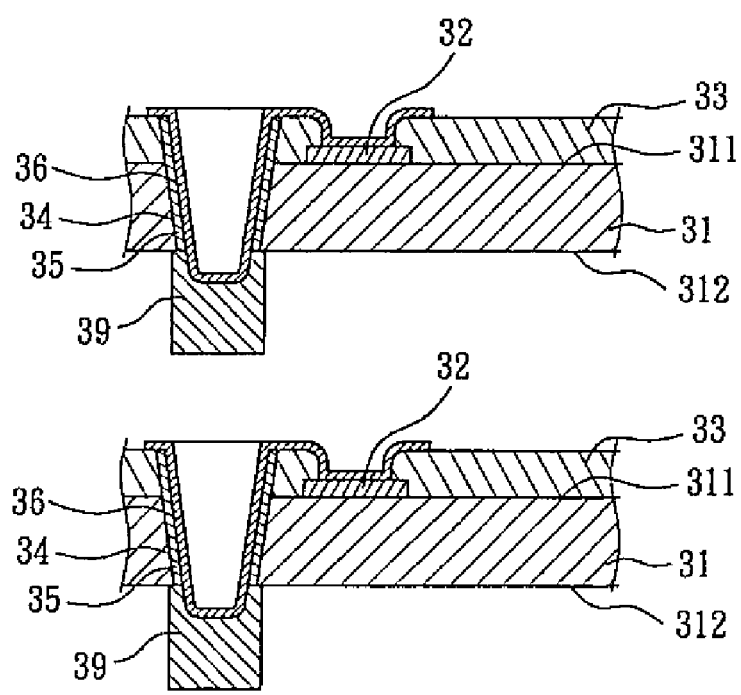

Afterward, referring to FIGS. 3 and 14, as shown in step S310, a plurality of the semiconductor bodies 31 are stacked. The solder 39 of the upper semiconductor body 31 is aligned with the space formed by the conductive layer 36 of the lower semiconductor body 31.

Figure 15:
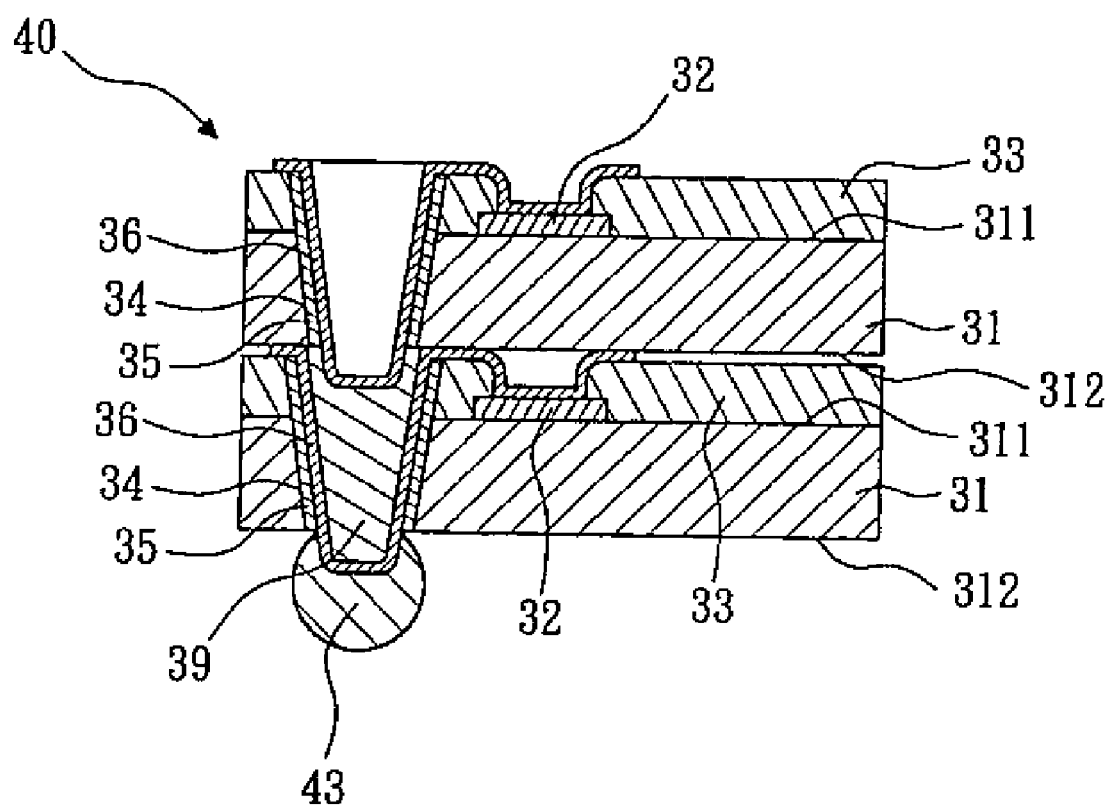

Then, referring to FIGS. 3 and 15, as shown in step S311, the reflow process is performed to make the solder 39 of the upper semiconductor body 31 melted in the space formed by the conductive layer 36 of the lower semiconductor body 31. Therefore, the two semiconductor bodies 31 are joined via the conductive layer 36 and the solder 39. Finally, as shown in step S312, the stacked semiconductor body 31 is cut to form a plurality of three-dimensional packages 40. Preferably, as shown in step S313, at least one solder ball 43 is formed below the three-dimensional package 40. The solder ball 43 is formed by the solder 39 on the lower end of the conductive layer 36 in the lower semiconductor body 31. It should be understood that this step is optional.

Figure 16:
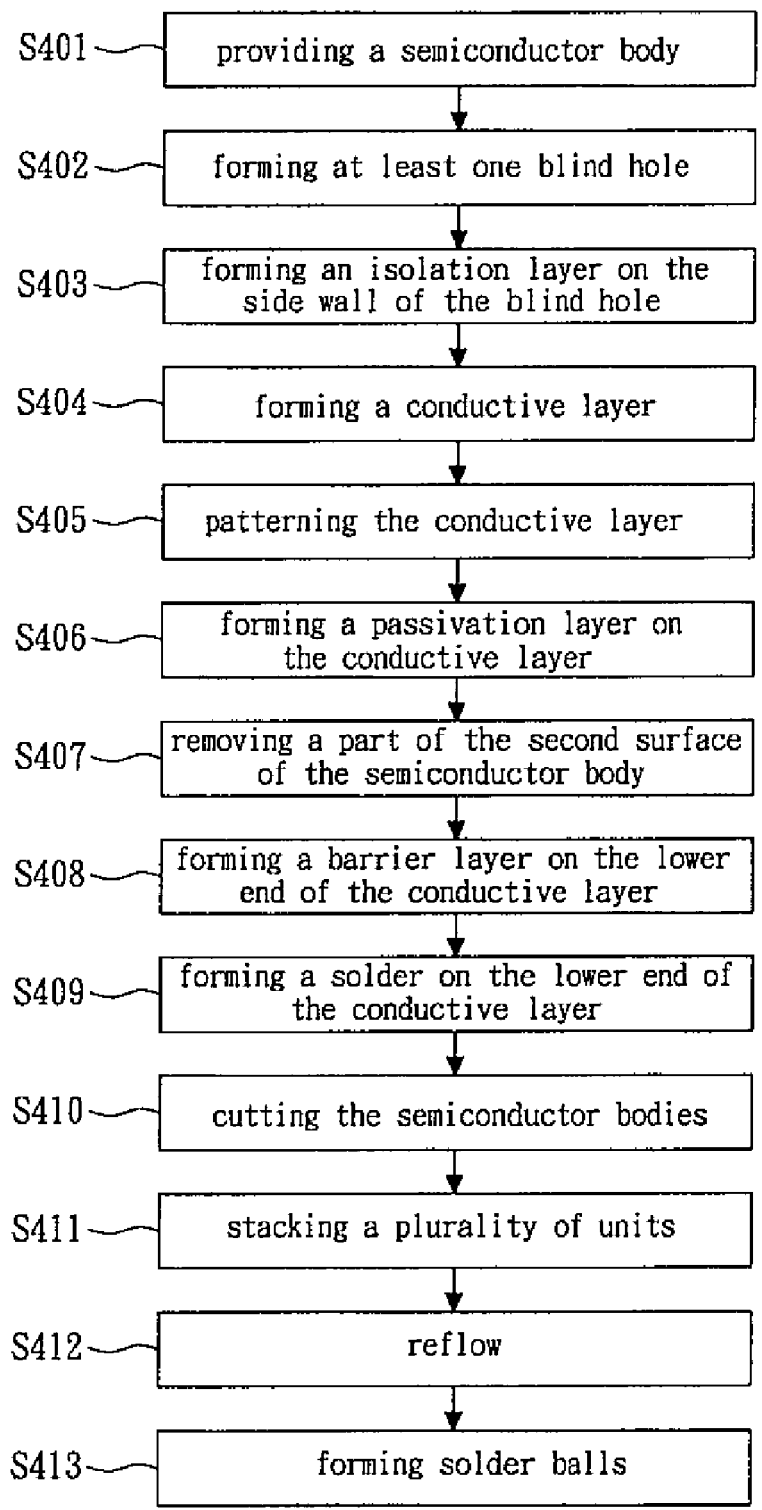
FIG. 16 shows a schematic flow chart of the method of making a three-dimensional package according to the second embodiment of the present invention.
Figure 17:
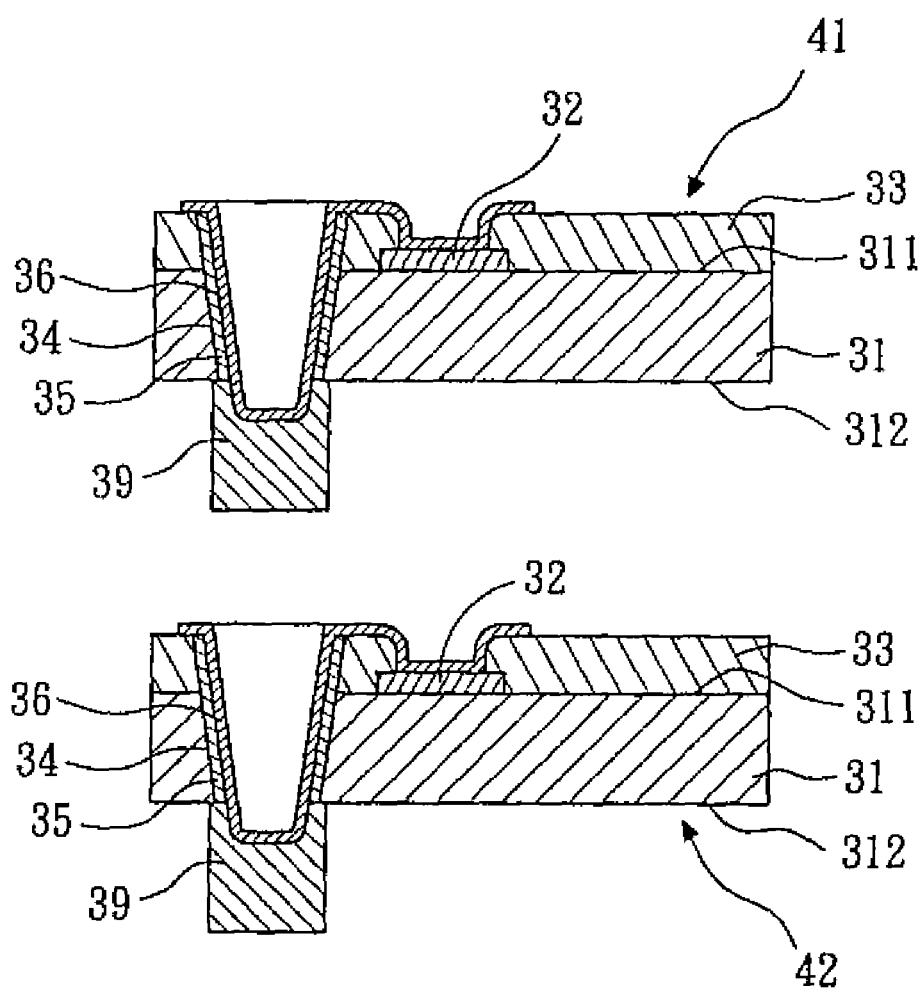
FIGS. 17 to 18 show the schematic views of a part of the process steps of the method of making a three-dimensional package according to the second embodiment of the present invention.
Figure 18:
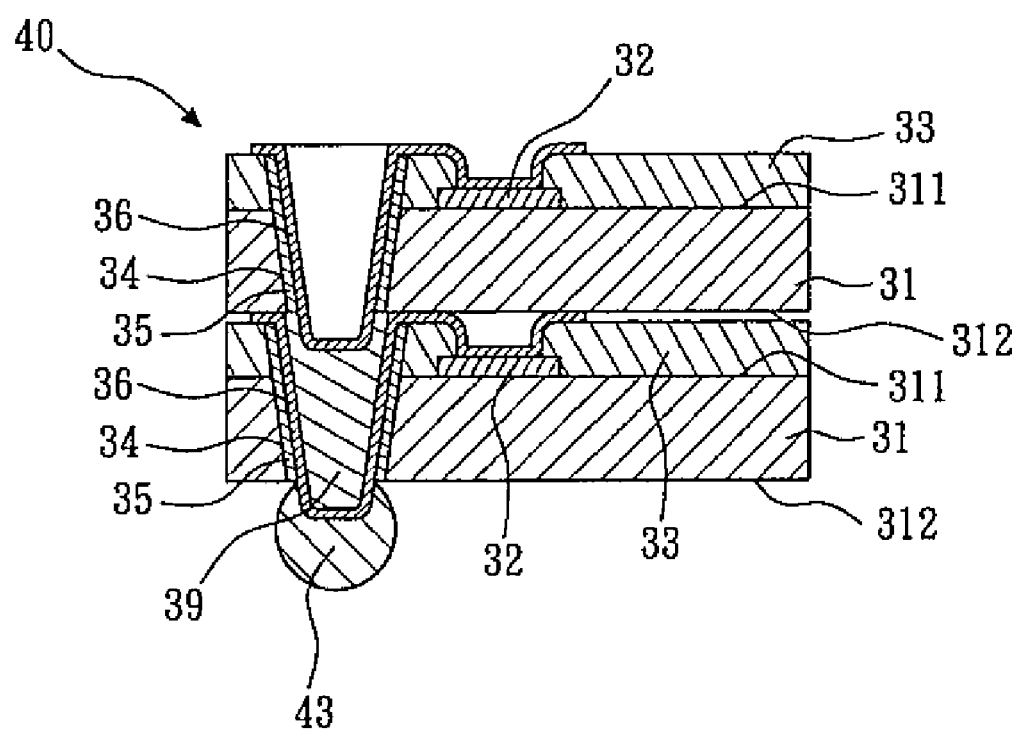

Referring to FIG. 16, it shows the schematic flow chart of the method of making a three-dimensional package according to the second embodiment of the present invention. The steps S401 to S409 of the present embodiment are identical to the steps S301 to S309 of the first embodiment. The difference between the embodiment and the first embodiment is as follows. In the step S410 of the present embodiment, the semiconductor body 31 is cut to form a plurality of units 41, 42. Then, in step S411, the units 41, 42 are stacked. The conductive layer 36 and the solder 39 of the upper and the lower semiconductor bodies 31 are aligned with each other, as shown in FIG. 17. Finally, in step S412, the reflow process is performed to form a plurality of three-dimensional packages 40, as shown in FIG. 18. The three-dimensional package 40 (FIG. 18) fabricated according to the present embodiment is identical to the three-dimensional package 40 (FIG. 15) fabricated according to the first embodiment.

Preferably, in step S413, at least one solder ball 43 is formed below the three-dimensional package 40. The solder ball 43 is disposed on the lower end of the conductive layer 36 in the lower semiconductor body 31. It should be understood that this step is optional.

Figure 19:
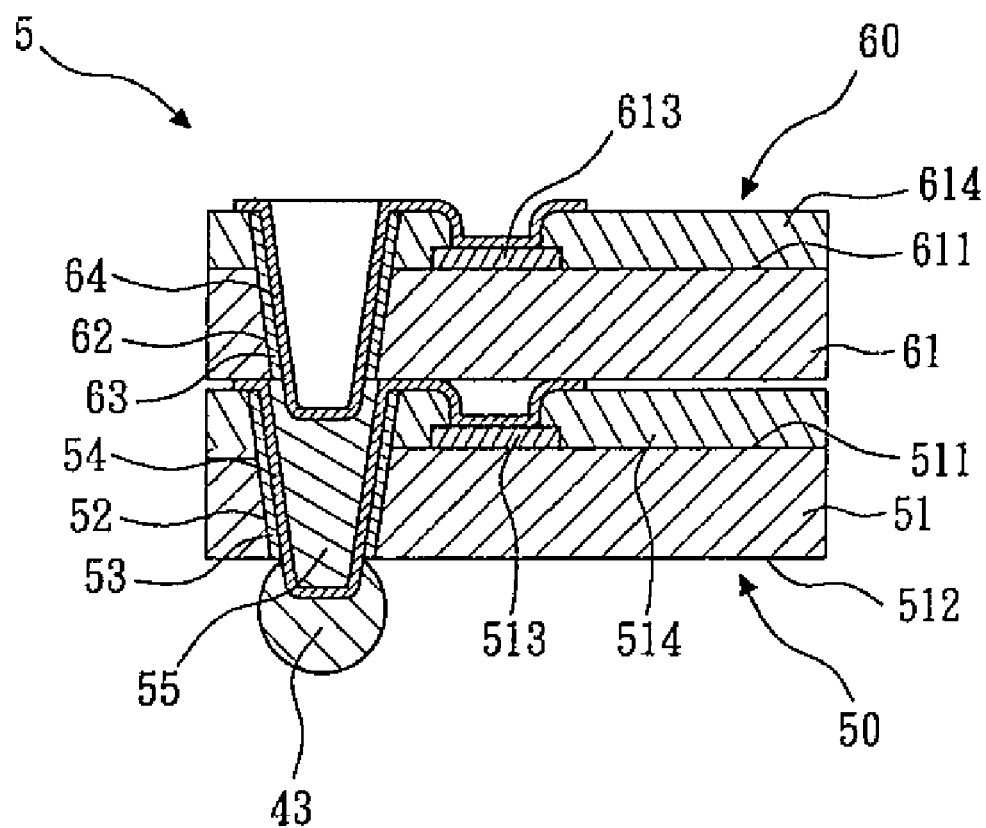
FIG. 19 shows a cross-sectional view of the three-dimensional package according to the present invention.

Referring to FIG. 19, it shows a cross-sectional view of a three-dimensional package of the present invention. The three-dimensional package 5 in this figure is identical to the three-dimensional package 40 in FIGS. 15 and 18. However, for the convenience of illustration, the identical elements are designated by different reference numbers. The three-dimensional package 5 comprises a first unit 50 and a second unit 60. The first unit 50 comprises a first semiconductor body 51, at least one first hole 52, a first isolation layer 53, a first conductive layer 54 and a first solder 55.

The first semiconductor body 51 is a wafer or a chip, and has a first surface 511 and a second surface 512. The first surface 511 has at least one first pad 513 and a first protection layer 514 exposing the first pad 513. The first hole 52 penetrates the first semiconductor body 51. In the present embodiment, the first hole 52 is disposed beside the first pad 513. Alternatively, the first hole 52 can penetrate the first pad 513.

The first isolation layer 53 is disposed on the side wall of the first hole 52. The first conductive layer 54 covers the first pad 513, a part of the first protection layer 514, and the first isolation layer 53. The lower end of the first conductive layer 54 extends to below the second surface 512 of the first semiconductor body 51. Preferably, the first unit 50 further comprises a first barrier layer (not shown) covering the lower end of the first conductive layer 54. Preferably, a passivation layer (not shown) is further disposed above the first conductive layer 54 and covers the first conductive layer 54 to protect the first conductive layer 54.

The first solder 55 is disposed inside the first hole 52, and is electrically connected to the first pad 513 via the first conductive layer 54.

The second unit 60 is stacked above the first unit 50. The second unit 60 comprises a second semiconductor body 61, at least one second hole 62, a second isolation layer 63 and a second conductive layer 64. The second semiconductor body 61 is a wafer or a chip, and has a first surface 611 and a second surface 612. The first surface 611 has at least one second pad 613 and a second protection layer 614 exposing the second pad 613. The second hole 62 penetrates the second semiconductor body 61. In the present embodiment, the second hole 62 is disposed beside the second pad 613. Alternatively, the second hole 62 can penetrate the second pad 613.

The second isolation layer 63 is dispose on the side wall of the second hole 62. The second conductive layer 64 covers the second pad 613, a part of the second protection layer 614, and the second isolation layer 63. The lower end of the second conductive layer 64 extends to below the second surface 612 of the second semiconductor body 61 and contacts the upper end of the first solder 55. Preferably, the second unit 60 further comprises a second barrier layer (not shown) covering the lower end of the second conductive layer 64. Preferably, a passivation layer (not shown) is disposed above the second conductive layer 64 and covers the second conductive layer 64 to protect the second conductive layer 64.

Moreover, if desired, a second solder (not shown) is filled into the second hole 62. Therefore, in the present invention, the second hole 62 is empty or filled with the second solder. Preferably, the three-dimensional package 5 further comprises at least one solder ball 43 disposed on the lower end of the first conductive layer 54.

In the three-dimensional package 5, the lower end of the second conductive layer 64 and the solder thereon are exposed below the second surface 612 of the second unit 60. Therefore, during the reflow process, the lower end of the second conductive layer 64 and the solder thereon are "inserted" into the space formed by the first conductive layer 54. The solder is melted in the space formed by the first conductive layer 54 to form the first solder 55. As such, the joint between the first conductive layer 54 and the second conductive layer 64 are enhanced. Further, the first hole 52 and the second hole 62 can be designed as a taper shape to enhance the foregoing joint. Moreover, the lower end of the second conductive layer 64 is "inserted" into the first solder 55, such that the overall height of the three-dimensional package 5 after joining can be effectively reduced.

While several embodiments of the present invention have been illustrated and described, various modifications and improvements can be made by those skilled in the art. The embodiments of the present invention are therefore described in an illustrative but not restrictive sense. It is intended that the present invention may not be limited to the particular forms as illustrated, and that all modifications which maintain the spirit and scope of the present invention are within the scope as defined in the appended claims.

What is claimed is:

1. A three-dimensional package, comprising:
    a first unit, comprising:
        a first semiconductor body, having a first surface and a second surface, the first surface having at least one first pad and a first protection layer exposing the first pad;
        at least one first hole, penetrating the first semiconductor body;
        a first isolation layer, disposed on the side wall of the first hole;
        a first conductive layer, covering the first pad, a part of the first protection layer, and the first isolation layer, wherein the lower end of the first conductive layer extends to below the second surface of the first semiconductor body; and
        a first solder, disposed in the first hole and electrically connected to the first pad via the first conductive layer; and
    a second unit, stacked on the first unit, the second unit comprising:
        a second semiconductor body, having a first surface and a second surface, the first surface having at least one second pad and a second protection layer exposing the second pad;
        at least one second hole, penetrating the second semiconductor body;
        a second isolation layer, disposed on the side wall of the second hole; and
        a second conductive layer, covering the second pad, a part of the second protection layer, and the second isolation layer, wherein the lower end of the second conductive layer extends to below the second surface of the second semiconductor body and contacts the upper end of the first solder.

2. The three-dimensional package according to claim 1, wherein the first and second semiconductor bodies are wafers.

3. The three-dimensional package according to claim 1, wherein the first and second semiconductor bodies are chips.

4. The three-dimensional package according to claim 1, wherein the first hole penetrates the first pad.

5. The three-dimensional package according to claim 1, wherein the second hole penetrates the second pad.

6. The three-dimensional package according to claim 1, wherein the first unit further comprises a first passivation layer covering the first conductive layer.

7. The three-dimensional package according to claim 1, wherein the second unit further comprises a second passivation layer covering the second conductive layer.

8. The three-dimensional package according to claim 1, wherein the first unit further comprises a first barrier layer covering the lower end of the first conductive layer.

9. The three-dimensional package according to claim 1, wherein the second unit further comprises a second barrier layer covering the lower end of the second conductive layer.

10. The three-dimensional package according to claim 1, further comprising at least one solder ball disposed at the lower end of the first conductive layer.

* * * * *